(12) United States Patent
Wasserman

(10) Patent No.: US 6,221,766 B1
(45) Date of Patent: Apr. 24, 2001

(54) METHOD AND APPARATUS FOR PROCESSING REFRACTORY METALS ON SEMICONDUCTOR SUBSTRATES

(75) Inventor: Yuval Wasserman, Sunnyvale, CA (US)

(73) Assignee: STEAG RTP Systems, Inc., San Jose, CA (US)

( * ) Notice: Subject to any disclaimer, the term of this patent is extended or adjusted under 35 U.S.C. 154(b) by 0 days.

(21) Appl. No.: 09/252,010

(22) Filed: Feb. 16, 1999

Related U.S. Application Data

(62) Division of application No. 08/788,935, filed on Jan. 24, 1997, now abandoned.

(51) Int. Cl.$^7$ .................................................. H01L 21/44
(52) U.S. Cl. .................. 438/656; 438/650; 438/648; 438/755; 438/754; 438/745
(58) Field of Search .................. 451/10, 28, 80, 451/123, 131, 331; 118/695, 724, 729, 52, 73, 107, 318; 438/755, 745, 754, 720, 721, 649, 655, 648, 656

(56) References Cited

U.S. PATENT DOCUMENTS

| | | | |
|---|---|---|---|
| 4,949,671 | * | 8/1990 | Davis et al. ......................... 118/725 |
| 4,951,601 | * | 8/1990 | Maydan et al. ...................... 118/719 |
| 4,994,140 | * | 2/1991 | Kenzo et al. ........................ 156/643 |
| 5,010,032 | | 4/1991 | Tang et al. . |
| 5,019,233 | * | 5/1991 | Blake et al. ..................... 204/792.12 |
| 5,164,331 | | 11/1992 | Lin et al. . |
| 5,330,633 | * | 7/1994 | Matsumoto et al. ............ 204/298.25 |
| 5,387,535 | | 2/1995 | Welmsmeyer . |
| 5,543,361 | | 8/1996 | Lee et al. . |
| 5,563,095 | * | 10/1996 | Frey ..................................... 437/141 |
| 5,676,590 | * | 10/1997 | Hiraoka ............................... 451/287 |
| 5,679,212 | * | 10/1997 | Kato et al. ........................ 156/636.1 |
| 5,728,625 | | 3/1998 | Tung . |
| 6,096,638 | * | 8/2000 | Matsubara ........................... 438/649 |
| 6,136,699 | * | 10/2000 | Inoue .................................. 438/656 |

* cited by examiner

Primary Examiner—Matthew Smith
Assistant Examiner—V. Yevsikov
(74) Attorney, Agent, or Firm—Connolly Bove Lodge & Hutz LLP

(57) ABSTRACT

The method and apparatus for heat treating and etching refractory metal and silicides of the refractory metal include integrated multi-chamber, multi-processing of substrates to react refractory metal and exposed silicon in self-aligned silicidation operations. Unreacted refractory metal on silicon oxide regions is selectively etched away distinctively from reacted silicide to yield highly precise self-aligned regions of silicide. Subsequent heat treatment at elevated temperatures reduces the sheet resistance of the silicide to yield highly conductive regions that are conducive to formation of conductor lines less than 0.25 μm wide.

8 Claims, 10 Drawing Sheets

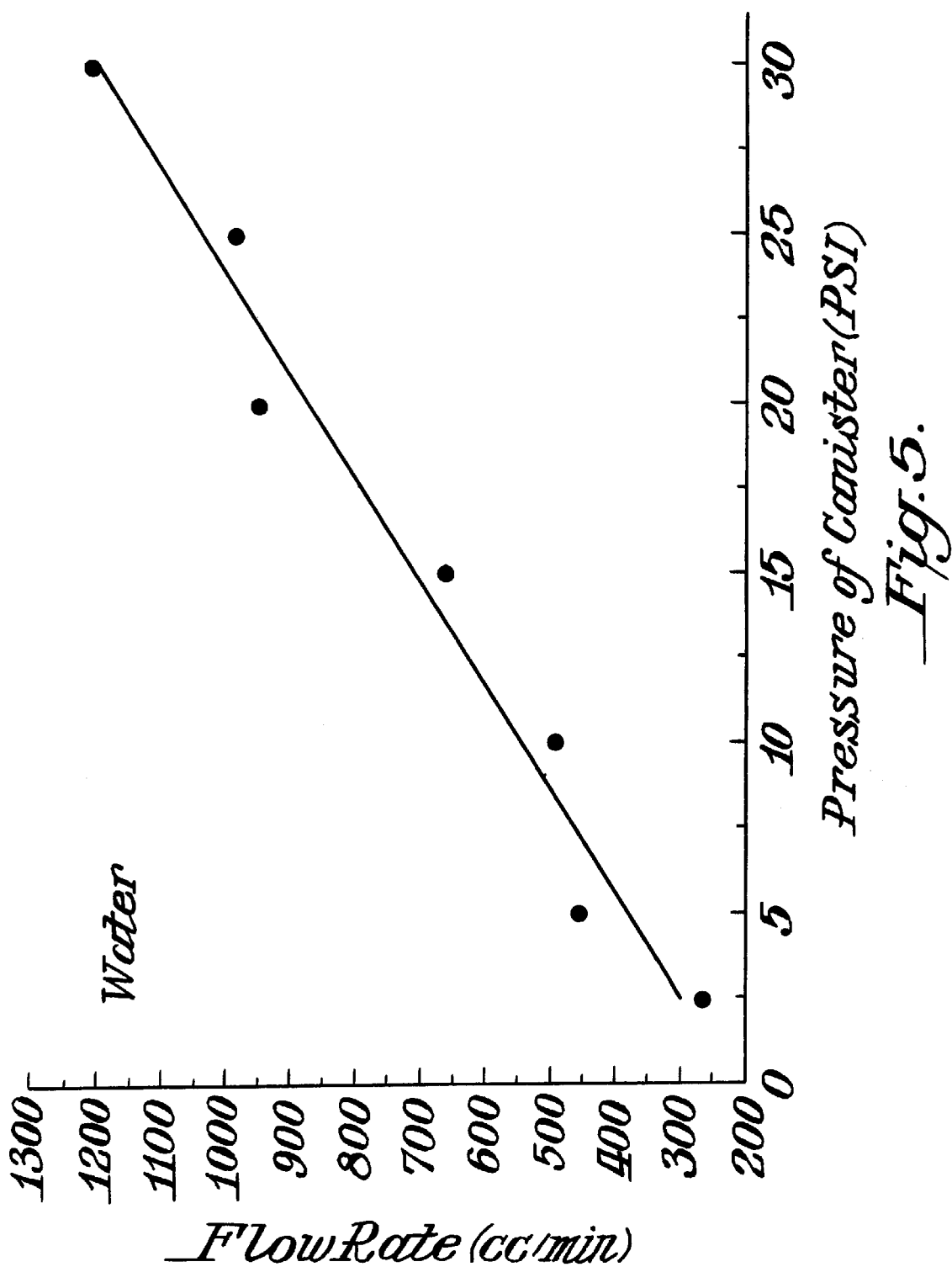

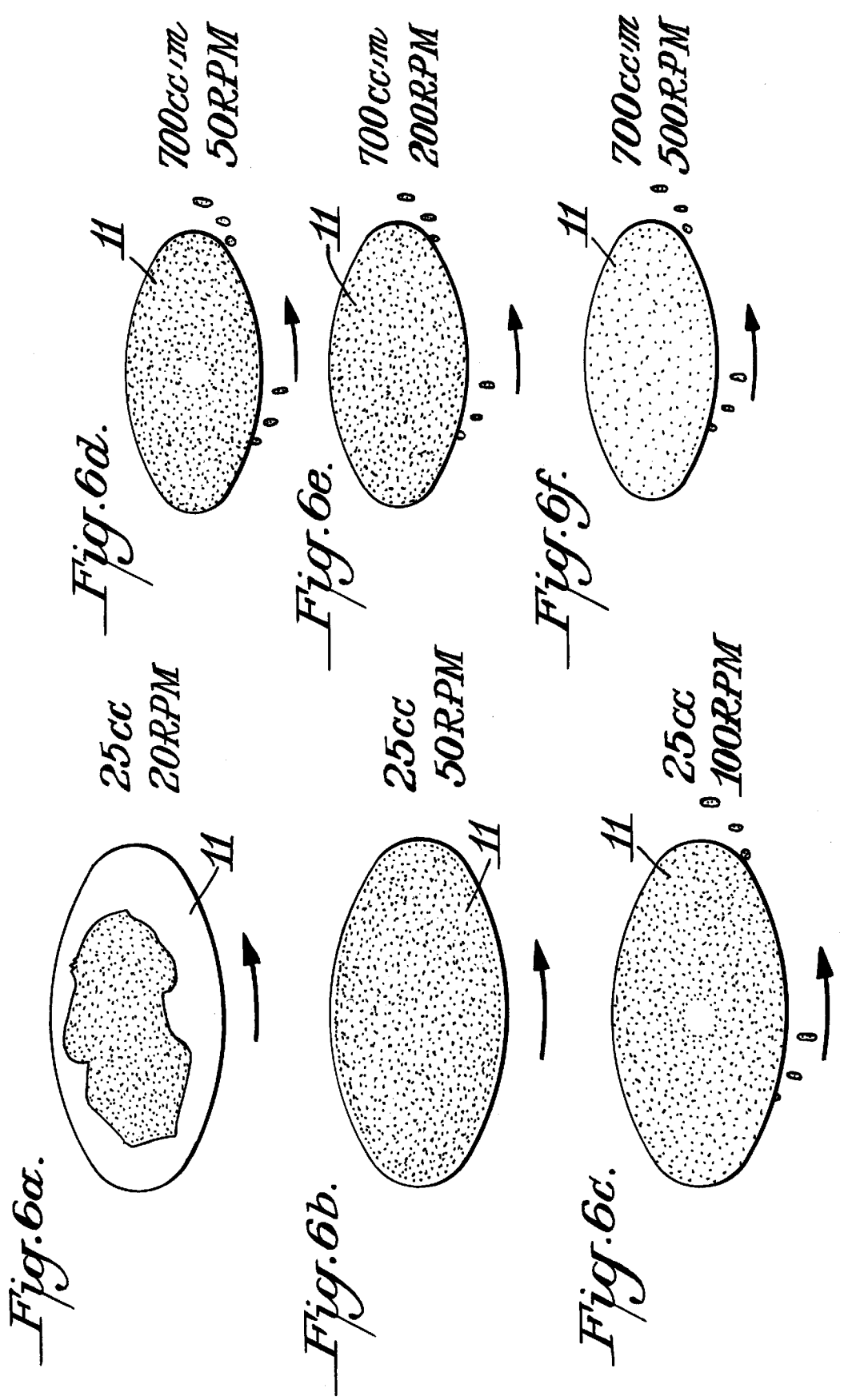

METHOD AND APPARATUS FOR PROCESSING REFRACTORY METALS ON SEMICONDUCTOR SUBSTRATES

This application is a divisional of U.S. patent application Ser. No. 08/788,935, filed Jan. 24, 1997, now abandoned.

FIELD OF THE INVENTION

This invention relates to semiconductor processing and more particularly to method and apparatus for integrated formation of self-aligned refractory metal silicides on silicon substrates.

BACKGROUND AND SUMMARY OF THE INVENTION

Recent improvements in ultra-large scale integration (ULSI) of circuitry on semiconductor substrates indicate that future generations of semiconductor devices will require less than one-quarter micron line widths and spacings with associated higher degrees of cleanliness in the processing of larger wafers using improved processing technologies for more reliable production of more complex devices. One important processing technology currently used in Complementary Metal Oxide Silicon (CMOS) processing technology is the Self-Aligned Silicidation (SALICIDE) of refractory metals such as titanium and cobalt. In a SALICIDE process using cobalt (Co), for example, the source/drain and polysilicon gate resistances are reduced by forming a high conductivity overlayer and the contact resistance is reduced by increasing the effective contact area. In SALICIDE technology using cobalt silicide (Co $Si_2$), a metallic layer of cobalt is sputtered onto the surface of patterned wafers, and desired reactions between cobalt and exposed silicon can be achieved by thermal activation at about 500° C. Unreacted cobalt disposed on a protective layer of silicon oxide can thereafter be selectively etched away, for example, using a solution of sulfuric acid and hydrogen peroxide in a ratio of about 4:1 to yield excellent selectivity of unreacted cobalt relative to reacted cobalt silicide. After such selective etch, thermal annealing at about 700° C. may be used to further reduce the sheet resistance of the remaining silicide regions to about 16–18 $\mu\Omega$-cm. Comparable levels of sheet resistance are attained with traditional titanium silicide processing.

The SALICIDE processing technology exploits the principle that a refractory metal such as cobalt deposited on a patterned silicon substrate will selectively react with exposed silicon under specific processing conditions, and will not react with underlying silicon oxide layers. As a result, a selective etch of non-reacted refractory metal results in a maskless, self-aligned formation of a low-resistivity refractory silicide in source, drain, and polysilicon gate regions and in interconnecting conductors of the semiconductor device. In practice, the refractory metal SALICIDE technology includes silicide transformation of deposited refractory metal on silicon via initial rapid thermal processing, or annealing, followed by selective etching away of unreacted refractory metal (typically on oxide regions), followed by a second rapid thermal processing or annealing of the remaining refractory silicide to reduce its resistivity. Improved apparatus and method of annealing and etching are provided for processing semiconductor substrates. Multiple-chamber annealing equipment and liquid etching apparatus are configured to facilitate sequential processing of each of a population of semiconductor wafers to selectively form thereon refractory silicide regions of low resistivity with high resolution in patterns that include thin line widths and narrow line spacings. One or more rapid thermal annealing chambers are integrated with liquid-etch equipment to promote the flow of semiconductor substrates through multiple stages of silicide processing. The liquid-etch equipment includes a rotatable support for a semiconductor substrate for spinning the substrate under a supply of etching solution to thereby chemically remove and physically clean unwanted etch reactants from the surface of the substrate. Automated handling of a substrate through chambers for thermal annealing and liquid etching thus transfer substrates in selected sequences from one supply or input cassette of such substrates, through the processing chambers, to another or output cassette that is positioned to receive each of the processed substrates into individual slots. Such single-wafer processing in selected sequences through the processing equipment facilities shortened processing cycle times for higher throughput of substrates per unit time per configured apparatus, and significantly reduces particulate contamination on substrate surfaces.

DESCRIPTION OF THE DRAWINGS

FIG. 5 is a graph illustrating the flow rate of water as a function of pressure in the canister of FIG. 4;

FIG. 6a) through 6f) are pictorial illustrations of surface coverage of liquid etchant as a function of spin rate of the coated substrate at constant volume or at constant flow rate;

DETAILED DESCRIPTION OF THE INVENTION

Figure 1:
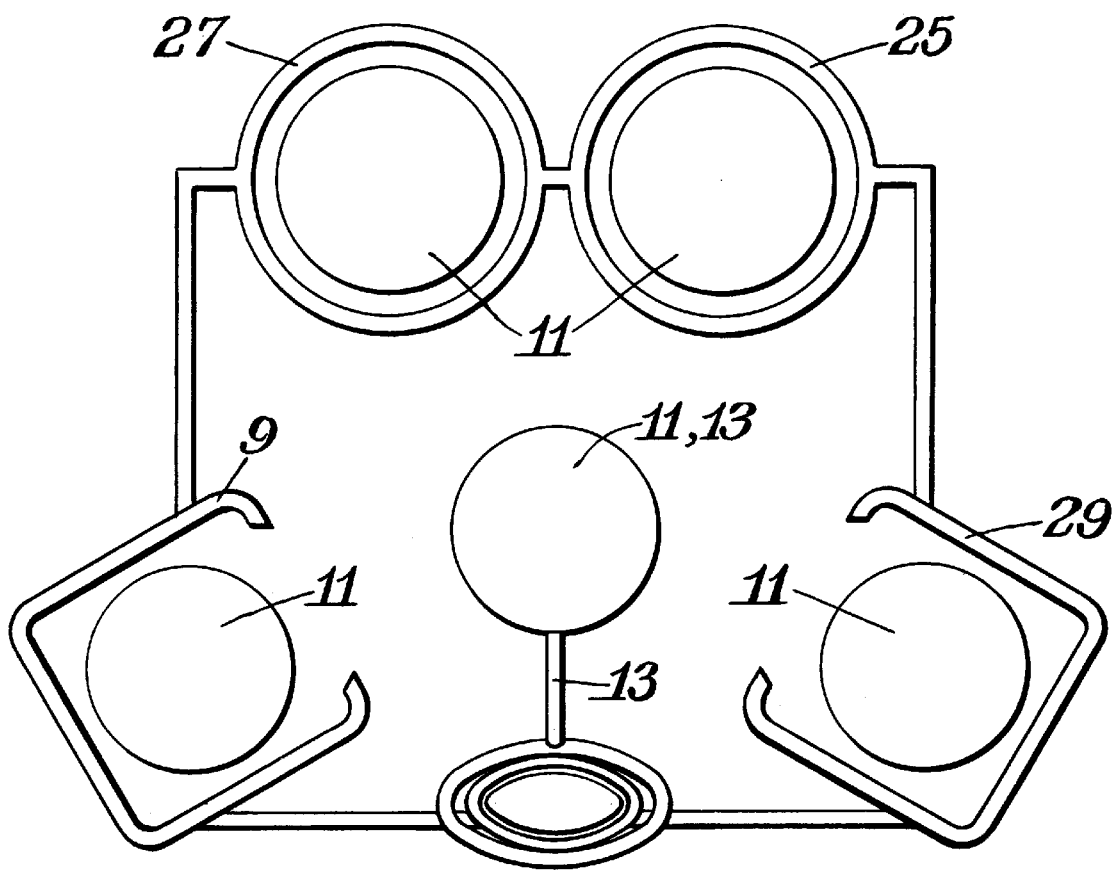
FIG. 1 is a pictorial plan view of processing apparatus according to one embodiment of the present invention.
Figure 8:
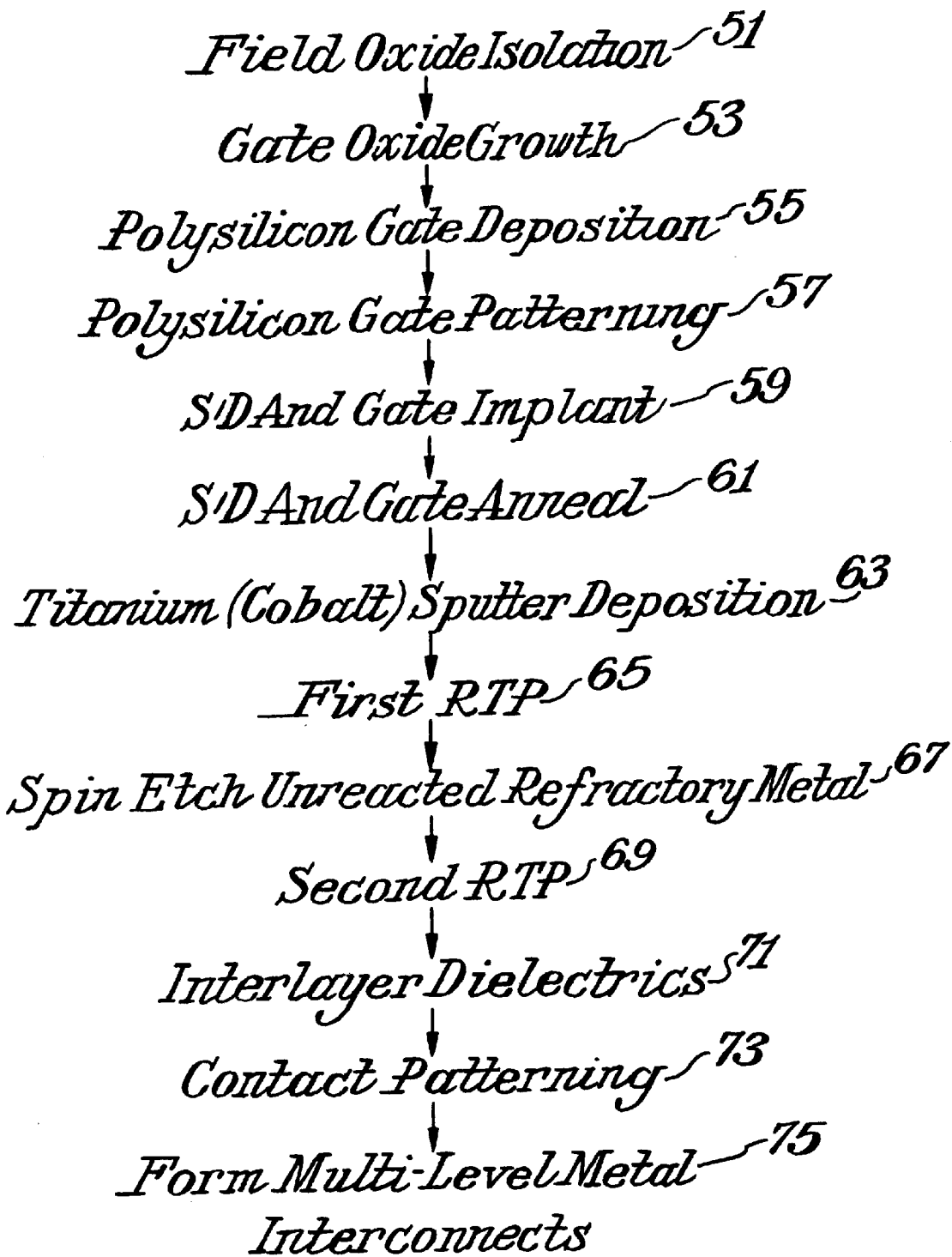
FIGS. 8 is a flow chart illustrating the SALICIDATION process according to one embodiment of the present invention.
Figure 9A:
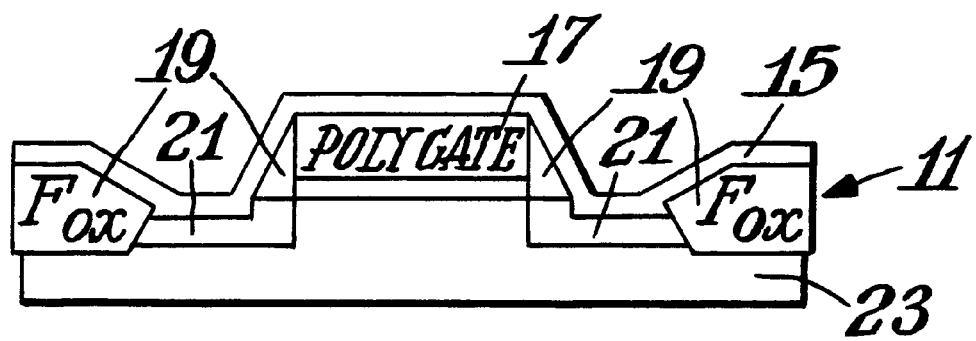
FIGS. 9a) through 9c) are partial sectional illustrations of the SALICIDATION process on a semiconductor substrate in accordance with the present invention.

Referring now to FIG. 1, there is shown a pictorial plan view of the assembled apparatus for performing the SALICIDATION process in accordance with the present invention. Specifically, a conventional cassette 9 containing semiconductor substrates, or wafers, 11 within individual slots of the cassette is disposed within a conventional elevator mechanism (not shown) for selectively vertically elevating the cassette to facilitate access to selected wafers in the individual slots of the cassette by a conventional robotic wafer handler 13. Each such wafer 11 may be previously prepared through one or more prior masking, deposition, and etching steps, as illustrated in FIG. 8, in order to form electrical components and circuit elements on the surface of the wafer 11 in conventional manner. In addition, each such wafer 11 includes a non-selectively deposited layer 15 of a refractory metal such as cobalt or titanium, as shown in FIG. 9a). Such layer 15 of refractory metal may be sputtered or chemically deposited in conventional manner onto surface regions of the wafer including polysilicon gate region 17, oxide regions 19, and dopant-diffused regions 21 of the monocrystalline silicon substrate 23 that form therein source and drain electrodes on opposite sides of the polysilicon gate region 17. Numerous such structures may be disposed substantially over the entire surface of each wafer 11 within segregated modules for subsequent separation from the wafer 11 into individual integrated circuits in conventional manner.

Figure 9B:
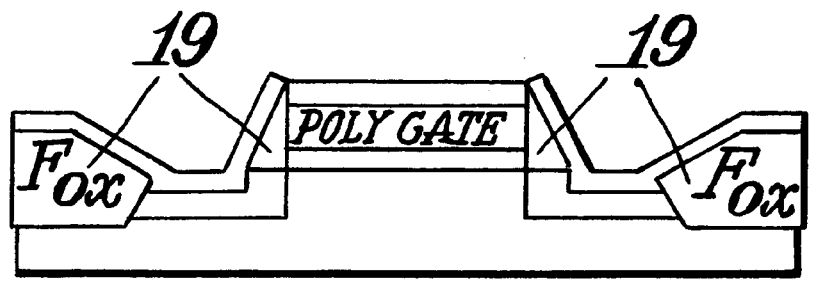

Wafers 11 thus prepared and assembled within slots in the cassette 9 are individually selectively removed therefrom and transported by the robotic wafer handler 13 for insertion into a rapid-thermal processing (RTP) chamber 25 of conventional configuration for an initial heat treatment or annealing step therein. Such RTP chamber 25 may include a plurality of radiant energy sources such as filamentary halogen lamps or gas-discharge lamps for rapidly heating the wafer. 11 and associated refractory metal layer 15 substantially at ambient pressure via the intense radiant flux from such lamps or sources. The temperature of the wafer may be elevated, typically within a few seconds to approximately 500° C. (for example, for cobalt silicide) and then maintained at such temperature for about 30 seconds. This reacts the refractory metal with exposed silicon and polysilicon surfaces (for example, in regions 17 and 21 shown in FIG. 9a)) to form refractory metal silicide in well-aligned orientation of such silicide with the underlying silicon regions. Rapid thermal processing in this manner does not react the deposited refractory metal in the oxide-coated regions such as 19 of the surface, and such unreacted refractory metal, as shown in FIG. 9b), can thereafter be selectively etched away from the oxide surfaces 19.

Figure 9C:
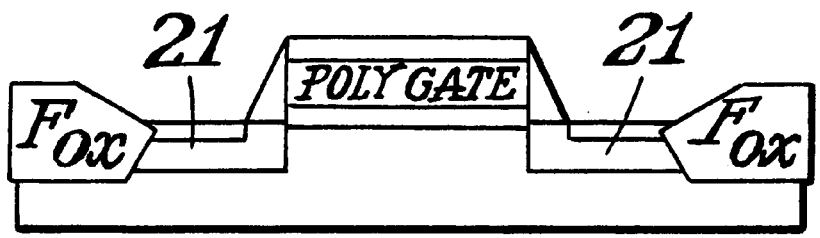

As illustrated in FIG. 1, the robotic wafer handler 13 may move the wafer 11 from chamber 25 following such RT processing to an etching chamber 27 for selective etch removal of unreacted refractory metal from oxide regions 19 on the surface of the wafer 11. In accordance with the present invention, liquid etching of the unreacted refractory metal, as later described herein, removes the refractory metal from the oxide surfaces, leaving the reacted silicide of the refractory metal in well-aligned orientation over the underlying, previously-exposed silicon surfaces 21 in the regions of gate, source, and drain electrodes (and circuit interconnects), as shown in FIG. 9c).

Figure 10:
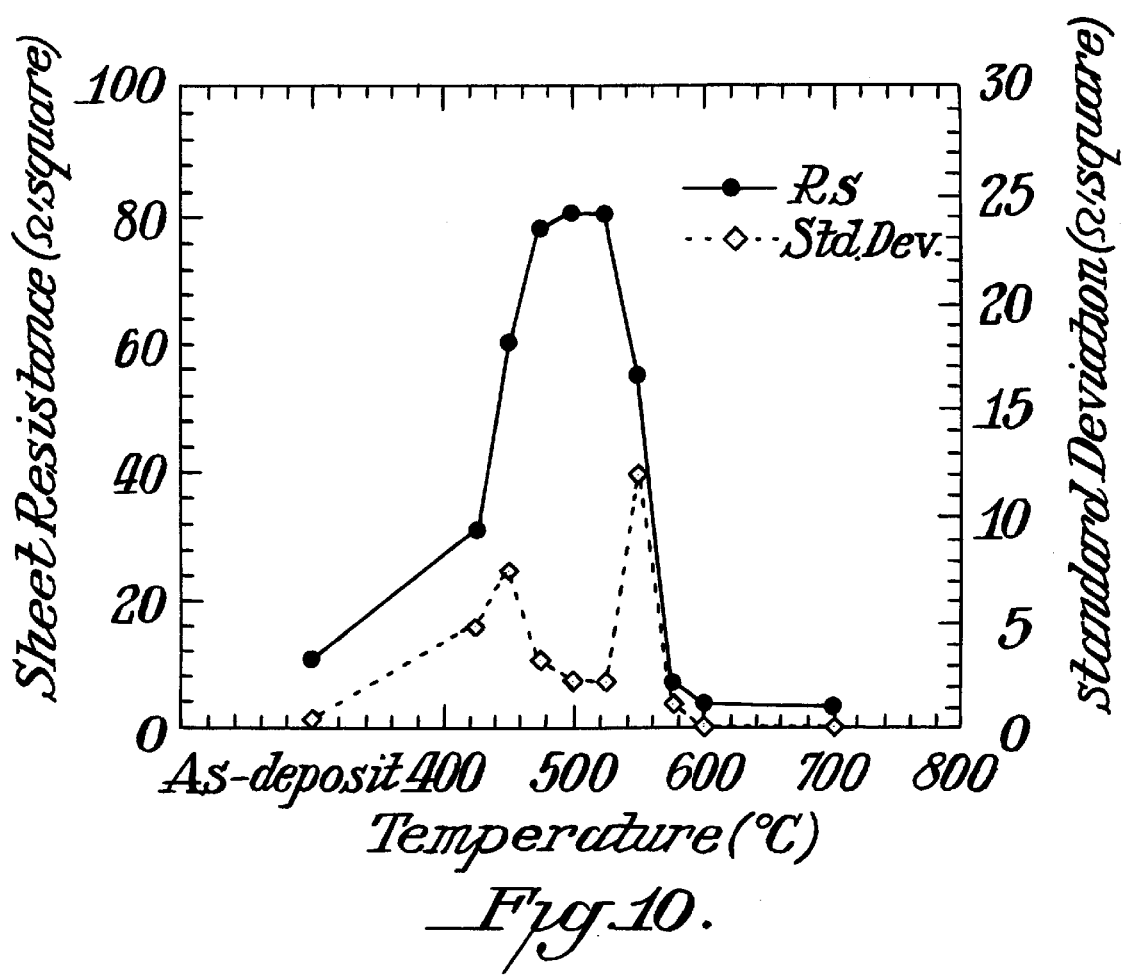
FIG. 10 is a graph illustrating the reduced sheet resistance of refractory metal silicide following heat treatment.

In accordance with the present invention, relatively high sheet resistance of the refractory-metal silicide (as high as about 85 Ω/square, for example, for cobalt silicide) remaining in place following the etch processing can be significantly reduced (to as low as about 3.3 Ω/square, for example, for cobalt silicide) by a second heat treatment of the wafer at temperatures of about 700° C. (for example, for cobalt silicide) for approximately 30 seconds. As illustrated in the graph of FIG. 10, the sheet resistance of cobalt silicide initially increases significantly upon heating to about 450° C., and remains stable but undesirably high at about 80 Ω/square for wafer temperatures of about 475° C. to about 550° C. At increased temperatures, sheet resistance of the refractory metal silicide significantly reduces to about 5 Ω/square at 600° C., and to its typical sheet resistance of about 3.3 Ω/square at a temperature of about 700° C. It is believed that such significant variations in sheet resistance, for example, for cobalt silicide, with elevated temperatures is indicative of the phase transformation:

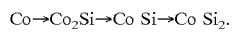

$Co \rightarrow Co_2Si \rightarrow Co\ Si \rightarrow Co\ Si_2$.

Such low sheet resistance following complete silicide transformation remains stable at lower temperatures and is ideally suited for sub-0.1 μm spacings and line widths in future ultra-large scale integrated circuitry.

Figure 2A:
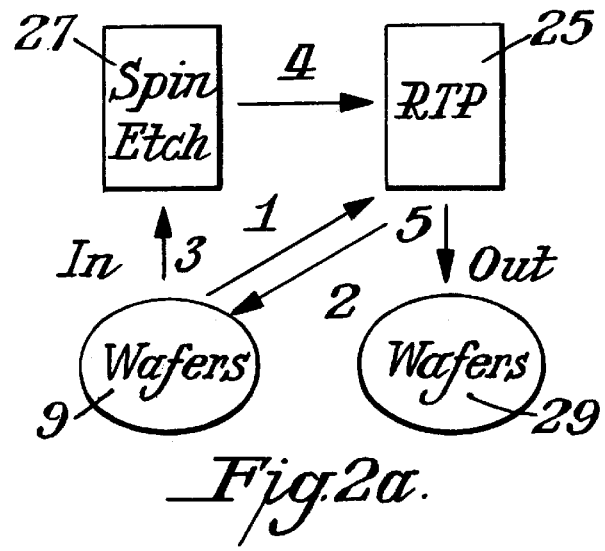
FIGS. 2a), b), and c) are pictorial illustrations of selected processing sequences for substrates according to alternative embodiments of the present invention.
Figure 2B:
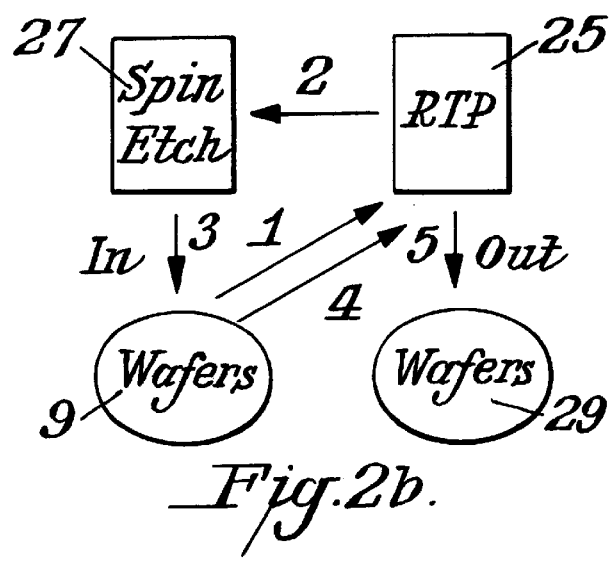

Accordingly, the wafer 11, after being etched in chamber 27 to remove unreacted refractory metal from oxide surfaces of the wafer 11, as shown in FIG. 9c), is re-positioned by the robotic wafer handler 13 into the RTP chamber 25 for a second heat treatment, or annealing, as discussed above to reduce the sheet resistance of fully-reacted silicide of the refractory metal in situ on the previously-exposed silicon surfaces of the wafer 11. Thereafter, the wafer 11 may be removed from the RTP chamber 25 and placed in an individual slot of a receiving cassette 29 that is similar to the supply cassette 9. One or more wafers 11 from cassette 9 may be so processed in succession through the sequence of process steps thus described, as shown in FIGS. 2a)–2c), to yield finished wafers 11 disposed in the receiving cassette 29. All of the wafer handling and RT processing and etching may be performed at ambient pressure to simplify wafer transfers and obviate the requirements for pressure vessels and seals, vacuum load-locks, and the like.

Referring specifically to the pictorial illustrations of FIGS. 2a) and 2b), there are shown the sequences of wafer 11 processing steps from supply wafer cassette 11, through first heat treatment in RTP chamber 25 to form the silicide of the deposited refractory metal, then through the liquid-etching chamber 27 (either directly following heat treatment 25, or after storage and retrieval in cassette 9) for removal of the unreacted refractory metal, then through second heat treatment in RTP chamber 25 (either from storage in cassette 9, or directly following liquid etching in chamber 27) to reduce sheet resistance of the refractory-metal silicide, and then to the wafer-receiving cassette 29.

Figure 2C:
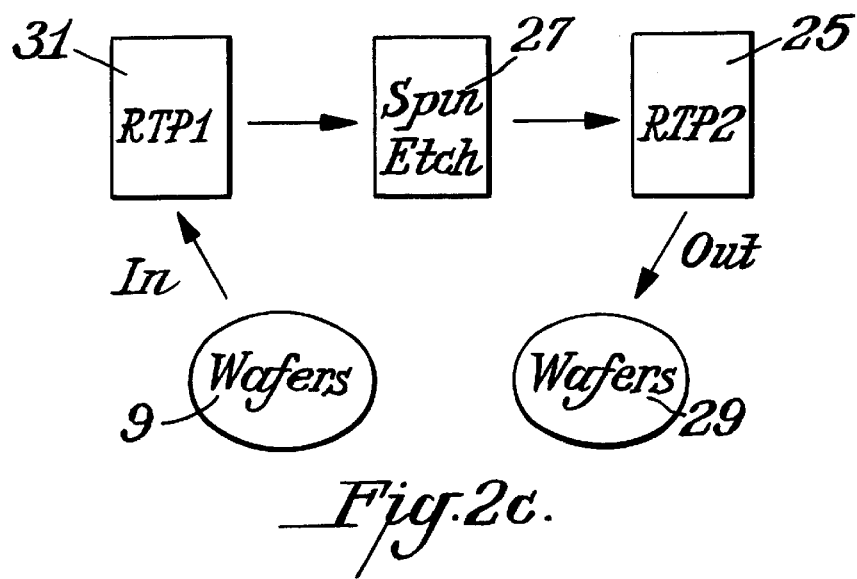

In accordance with another embodiment of the apparatus of the present invention, as shown pictorially in FIG. 2c), an additional RTP chamber 31 is positioned to facilitate first RT processing and the RTP chamber 25 is positioned to facilitate second RT processing, following the liquid etching process, all for convenient sequential processing of wafers 11 at higher throughput rates in the manner described above.

Figure 3:
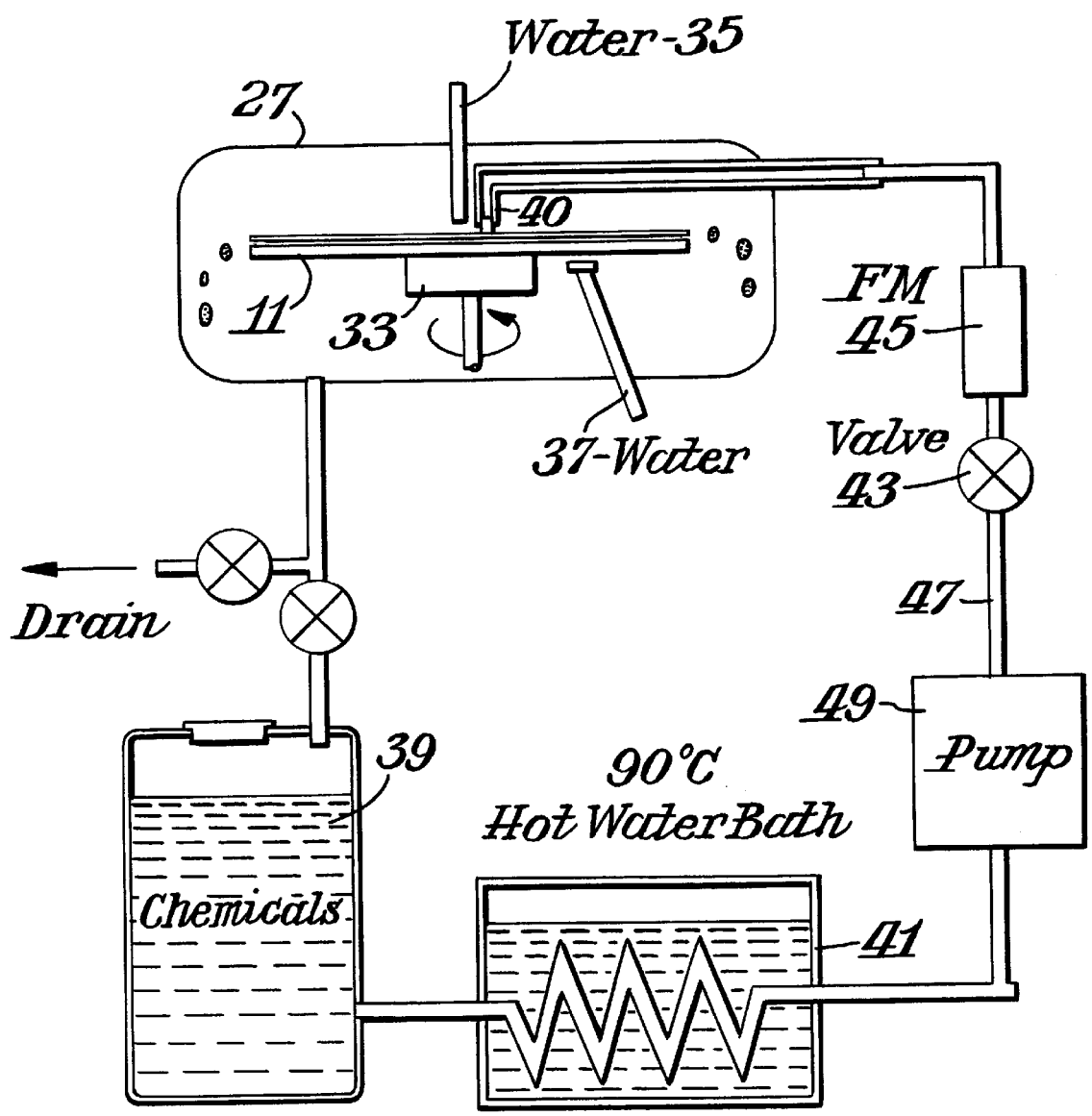
FIG. 3 is a pictorial schematic diagram of the liquid etch processing according to the present invention.

Referring now to FIG. 3 there is shown a pictorial diagram of the liquid. etching process in chamber 27. Specifically, a susceptor 33 is rotatably mounted to spin a wafer 11 positioned thereon substantially in a horizontal plane. Deionized, filtered water at an elevated temperature of about 90° C. is distributed 35, 37 onto the upper and lower surfaces of the wafer 11 to facilitate uniform heating and surface wetting of the wafer 11. In addition, an etching solution 39 (for example sulfuric acid and hydrogen peroxide in a ratio of about 4:1, for etching unreacted cobalt) is also distributed 40 at an elevated temperature 41 of about 90° C. onto the upper surface of the wafer 11 that contains the reacted silicide and unreacted refractory metal. A selected volume of etchant 39 may be distributed 40 onto the upper surface of the wafer 11 as it is spun at a selected angular velocity. In this way, optimum surface coverage of the wafer using minimal volumes of etchant 39 may be achieved. Alternatively, continuous distribution of etchant 39 at a selected volumetric flow rate onto the upper surface of the wafer 11 may also be achieved using a control valve 43 and flow meter 45 connected in the supply line 47 from pump 49, while the wafer 11 is spun on susceptor 33 at a selected angular velocity. Optional pre-rinse and post-rinse of the wafer with heated water before and/or after liquid etch may also be used to control wafer temperature as well as to flush particulate contaminants from the wafer surface.

Figure 4:
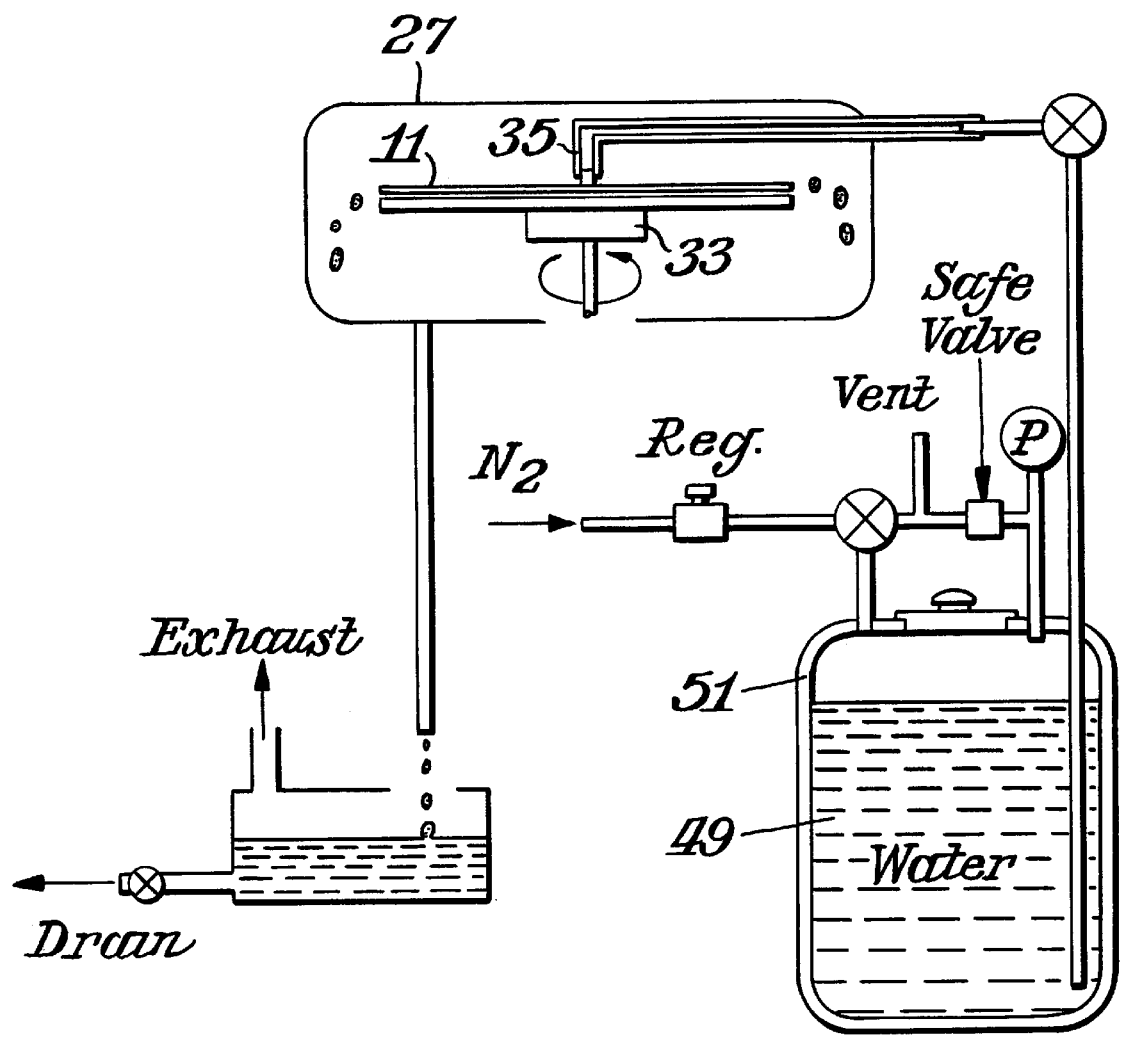
FIG. 4 is a pictorial schematic diagram of the liquid-etch equipment according to one embodiment of the present invention.

As illustrated in FIG. 4, deionized and filtered water 49 (or, optionally, etchant after and/or before water) may be supplied under pressure at a selected temperature of about 90° C. to both heat the wafer 11 and clean the surfaces thereof before and/or after etching the unreacted refractory metal therefrom. The flow rate of liquid may be conveniently controlled in response to the pressure of unreactive gas (e.g. nitrogen) within the vessel 51, as shown in the graph of FIG. 5.

Referring now to the pictorial illustrations in FIGS. 6a) through 6f), there are shown examples of liquid processing on wafers at various angular spin velocities and volumes of liquid distributed on the wafers 11. Thus, as shown in FIG. 6a), a liquid volume of about 25 cc once distributed onto the surface of a 6" wafer spinning at about 20 RPM is insufficient to uniformly coat and wet the wafer surface. As shown in FIG. 6b), such volume of liquid may adequately wet and uniformly coat the wafer 11 when spun at about 50 RPM. And as shown in FIG. 6c), the same liquid volume distributed onto the wafer spun at about 100 RPM may non-uniformly coat the surface of the wafer 11, and also produce waste ejected from the surface of the wafer 11.

Similarly, at high volumetric flow rates and various angular spin velocities, as shown in FIGS. 6d)–6f), substantially uniform liquid coating of the wafer surface may be achieved, with waste ejected from the wafer, by supplying continuous volumetric liquid flow at rates of about 700 cc/minute onto the wafer spinning at angular velocities up to about 500 RPM. Such liquid processing of spinning wafers may be accomplished using conventional spin coaters, for example, as commercially available from Laurell Technologies Corp of Lansdale, Pa.

Figure 7A:
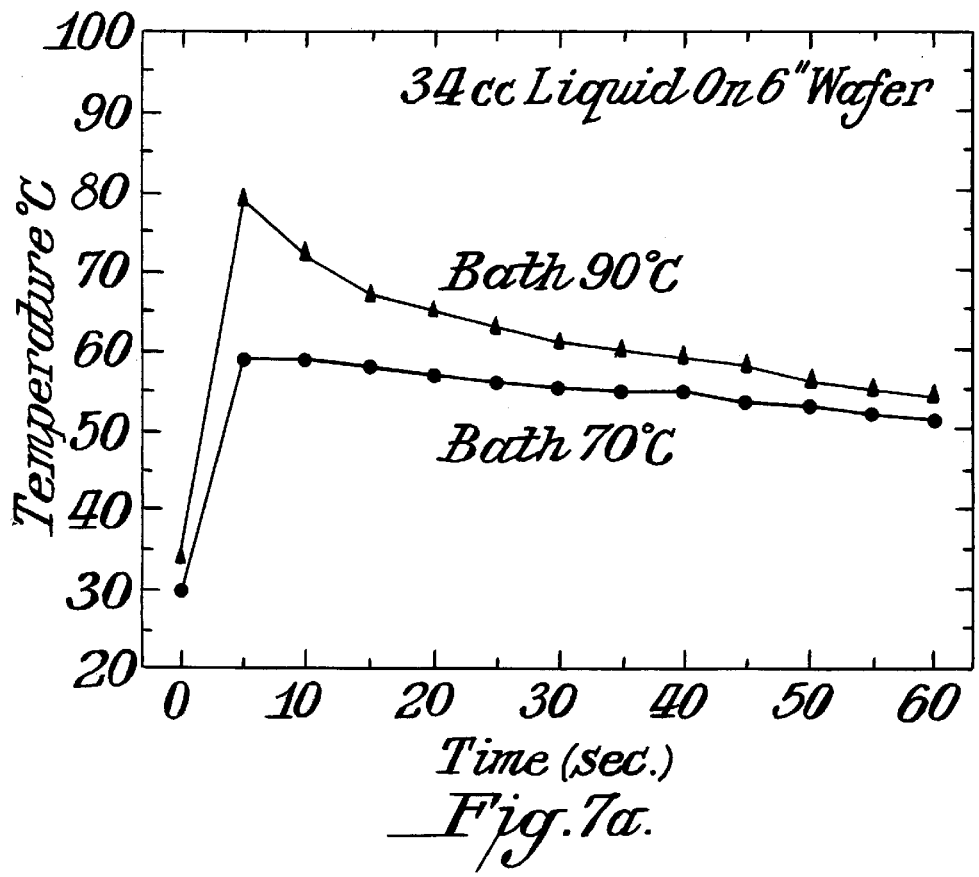
FIGS. 7a) and 7b) are graphs illustrating rate of change in temperatures of a substrate coated with liquid etchant at elevated temperatures.
Figure 7B:
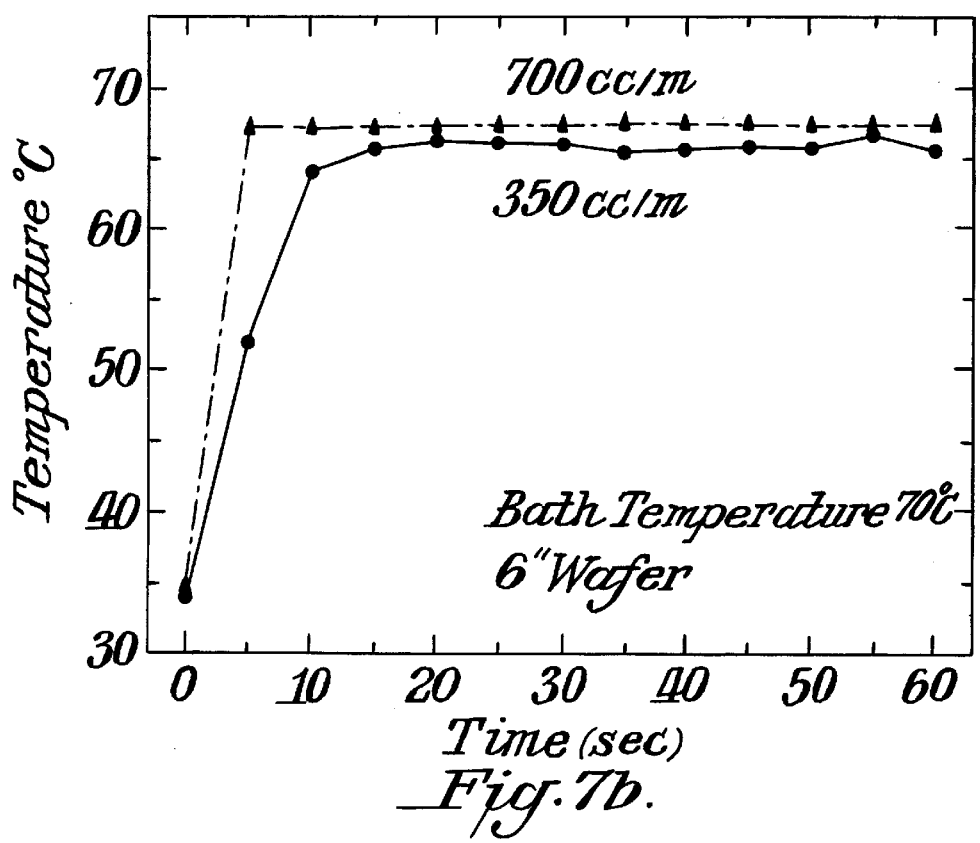

Referring now to FIG. 7a), there is shown a graph illustrating the temperature variations over time of the wafer 11 following distribution thereon of a specific volume of heated liquid at various initial temperatures. Similarly, FIG. 7b) is a graph illustrating wafer temperature in response to continuous supply thereto of water at about 70° C. while the wafer is spinning. From these data over a wide range of pulse or continuous supplies of volumes of heated liquid to a wafer (of about 6" diameter) spinning at various velocities, it should be noted that desirable uniformity of heating, and surface coating, and undesirable ejection of waste may be resolved for wafers of selected diameters (typically 6" to 8" diameters). The wafer temperature (as a result of liquid etchant temperatures should be maintained at about 70–90° C. During the selective etch, the selectivity may not be affected significantly by temperature variations as long as the wafer is maintained within the temperature range of about 70–90° C.

Referring now to the flow chart of FIG. 8, there is shown a sequence of processing steps by which silicides of refractory metal are formed with precision self-aligned orientations in situ to provide highly conductive regions typically narrower than 0.25 μm. Specifically, initial processing of a semiconductor substrate in preparation for treatment according to the present invention may include growth of field oxides in selected regions of the substrate using conventional processes. Additionally, gate oxides may also be formed by conventional processing 53 in regions of the substrate where insulated-gate field-effect transistors are to be formed. The polysilicon may be deposited 55 over such selected gate oxide regions in the substrate for selective patterning and etching 57, all by conventional processing, to form aligned gates and other circuit components. Thereafter, surface doping and diffusion or ion-implantation of selected n-type and p-type dopant impurities may be performed using conventional processing to form 59 and anneal 61 active junctions and complementary conductivity type regions in the substrate.

In accordance with the present invention, a substrate thus prepared may be sputter coated 63 with a refractory metal such as titanium or cobalt to a thickness of about 250Å or 150Å, respectively, (for line widths of less than about 0.25 μm), for example, using conventional processing such as magnetron sputtering deposition of a refractory metal in vacuum, as shown in FIG. 9a). As illustrated in FIGS. 2a), 2b), and 2c), an initial rapid thermal processing or annealing 65 of the substrate reacts the refractory metal with exposed silicon (but not with the silicon oxides) to form in situ regions of reacted silicide of the refractory metal as shown in FIG. 9b). Thereafter, liquid etching of the unreacted refractory metal in the spin-etch chamber 27 removes the unreacted refractory metal 67 from the oxide regions, but does not significantly remove the reacted silicide formed on the previously exposed silicon regions, as shown in FIG. 9c). Thereafter, the substrate may be rapidly thermally processed or annealed 69 a second time following liquid etching to reduce the sheet resistance of the refractory-metal silicides in situ to yield the self-aligned structure as illustrated in FIG. 9c). Thereafter, subsequent conventional processing of the substrate to lay down 71 interlayer dielectrics and to form requisite contact patterns 73 and metal interconnects 75 thus complete the processing of the substrate which is then diced up in conventional manner to form individual integrated circuits.

Therefore, the SALICIDE processing and apparatus according to the present invention thus provide self-aligned, highly conductive regions in the semiconductor substrate using refractory metal and heat treatment to selectively form silicides in situ that can be annealed to exhibit low sheet resistance and high-precision alignment relative to contiguous regions of surface oxide. High yield of acceptable substrates results from the closed and controlled environment according to the present invention which also reduces the cycle times for processing substrates by reducing queue delays at processing stations. Capital investments in equipment can be reduced through the integration of stand-alone thermal processing and liquid etching tools into a single unit according to the present invention, with associated reductions in manual handling of substrates through separate processing operations.

What is claimed is:

1. An integrated substrate processing system including a substrate carrier for supporting a plurality of substrates in stacked relation, the system comprising:

a first chamber for thermally treating a single substrate held therein to a selected elevated temperature, wherein said first chamber includes a first substrate support;

a second chamber for performing liquid etching on substrates positioned therein wherein said second chamber includes a second substrate support that is mounted for rotational motion about an axis substantially perpendicular to one surface of the substrate when the substrate is disposed on the second substrate support, and includes apparatus for selectively delivering liquid to one surface of the substrate disposed on the second substrate support for rotation therewith; and a substrate transport disposed for moving a selected one of the substrates between the carrier and the first chamber and the second chamber in a selected sequence for said substrate for elevating the temperature of the substrate in the first chamber substantially to a selected temperature, and for liquid etching the substrate in the second chamber.

2. The system according to claim 1 wherein the first chamber is selectively operable to elevate the temperature of substrates therein to plural different temperatures.

3. The system according to claim 1, comprising:
a third chamber disposed relative to the substrate transport for receiving and heating the substrate therein to an elevated temperature different from the temperature to which the substrate is elevated in the first chamber so that the substrate may be processed in a selected sequence in the first chamber and the second chamber and the third chamber.

4. The system according to claim 1, further comprising:
a first conduit for delivering etching liquid to said one surface of the substrate disposed on the substrate support.

5. The system according to claim 4, further comprising:
a second conduit for delivering rinsing liquid to said one surface of a substrate disposed on the substrate support for flushing away particles and contaminants thereon.

6. The system according to claim 1, further comprising a first conduit for delivering heated etching liquid to said one surface of the substrate disposed on the substrate support.

7. The system according to claim 1, further comprising an enclosure that surrounds the first chamber, the second chamber and the substrate transport.

8. The system according to claim 1, wherein the substrates are semiconductor wafers.

* * * * *